(12) United States Patent
Tseng et al.

(10) Patent No.: US 6,399,495 B1
(45) Date of Patent: Jun. 4, 2002

(54) COPPER INTERCONNECTIONS FOR METAL-INSULATOR-METAL CAPACITOR IN MIXED MODE SIGNAL PROCESS

(76) Inventors: Ling-Hsu Tseng, 6F-3, No. 446-1, Ming-Hu Rd.; Der-Yuan Wu, 14, Alley 10, Lane 452, Pao-Shan Rd., both of Hsin-Chu City (TW)

( * ) Notice: Subject to any disclaimer, the term of this patent is extended or adjusted under 35 U.S.C. 154(b) by 0 days.

(21) Appl. No.: 09/707,249

(22) Filed: Nov. 6, 2000

(51) Int. Cl.[7] .................... H01L 21/44; H01L 24/8242
(52) U.S. Cl. ........................ 438/687; 438/239
(58) Field of Search ................... 438/687, 626, 438/627, 680, 629, 643, 633, 692, 618, 239, 243, 253, 393, 396; 257/752

(56) References Cited

U.S. PATENT DOCUMENTS

| | | | | |
|---|---|---|---|---|
| 5,532,516 A | * | 7/1996 | Pasch et al. | 257/752 |
| 6,010,962 A | * | 1/2000 | Liu et al. | 438/687 |
| 6,080,656 A | * | 7/2000 | Shih et al. | 438/626 |

* cited by examiner

*Primary Examiner*—David Nelms
*Assistant Examiner*—Thao P. Le

(57) ABSTRACT

A method for forming a metal-insulator-metal (MIM) capacitor and an interconnect in integrated circuits is provided. First, a substrate with a plurality of conductive blocks under a surface of substrate is provided. Then, a first nitride layer is deposited on the substrate and then a first inter-metal-dielectric (IMD) layer is formed thereon. Next, a second nitride layer and a second IMD layer are sequentially formed on the first IMD layer. Thereafter, a first mask is formed on the second IMD layer with a first opening to expose the second IMD layer. Next, a first etching process is performed to form a via through the second IMD layer, the second nitride layer, the first IMD layer and the first nitride layer in the first opening to expose one of those conductive blocks. Then, a second etching process is performed to form a hole to expose the first nitride layer, wherein the hole is above one of those conductive blocks. Last, a conductive material is filled into the via and the hole to form the MIM capacitor and the interconnection.

21 Claims, 4 Drawing Sheets

COPPER INTERCONNECTIONS FOR METAL-INSULATOR-METAL CAPACITOR IN MIXED MODE SIGNAL PROCESS

BACKGROUND OF THE INVENTION

1. Field of the Invention

The present invention generally relates to a method for forming a metal-insulator-metal (MIM) capacitor and interconnects in integrated circuits, and more particularly relates to a method for forming a metal-insulator-metal (MIM) capacitor and copper interconnects in a mixed mode signal process.

2. Description of the Prior Art

Along with the advance of semiconductor fabrication, ultra large semiconductor integration (ULSI) increasingly replaces very large semiconductor integration (VLSI) in many products and applications. Accompanying this trend, many useful fabrications of VLSI are becoming known. It is now desired to develop new fabrications.

As important example is that copper has become a promising candidate to replace aluminum of ULSI interconnections due to its better conductivity and reliability, which his more significant when the electromigration is more serious along with the decrement of the width of interconnections.

Along with the development of ULSI, layout rule will shrink and the application of the product is likely to expand the development of multi-chips of integrated functions. Hence, it is more and more important to regulate or combine copper processes and another complicated process, such that copper interconnection for MIM capacitor in a mixed mode signal process.

SUMMARY OF THE INVENTION

The object of the invention is to provide a method for forming a MIM capacitor and copper interconnections in a mixed mode signal process.

Another object of the invention is to use copper as the top and the bottom electrode so that one level of metallization can be elimintated.

In order to achieve the previous objections of the invention, a method comparing the following essential steps is provided. First, a substrate with a plurality of conductive blocks under a surface of substrate is provided. The conductive blocks can be made of a metal, such as copper. Then, a first nitride layer is deposited on the substrate and then a first inter-metal-dielectric (IMD) layer is formed thereon. Next, a second nitride layer and a second IMD layer are sequentially formed on the first IMD layer. Thereafter, a first mask is formed on the second IMD layer with a first opening to expose the second IMD layer. Next, a first etching process is performed to form a via through the second IMD layer, the second nitride layer, the first IMD layer and the first nitride layer in the first opening to expose one of those conductive blocks. Then, a second etching process is performed to form a hole to expose the first nitride layer, wherein the hole is above one of those conductive blocks. Last, a conductive material is filled into the via and the hole to form the MIM capacitor and the interconnection. The conductive material can be made of a metal, such as copper.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The semiconductor devices of the present invention are applicable to a broad rang of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Further, although the embodiments illustrated herein are show in two-dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

Figure 1A:
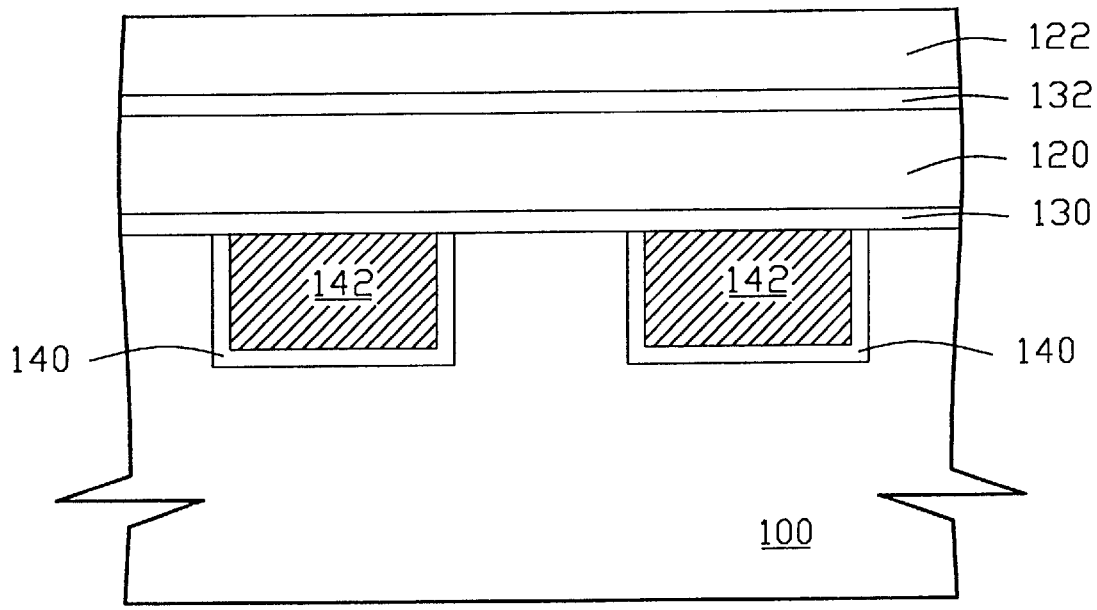
FIG. 1A to FIG. 1D are four brief cross-section illustrations showing the fabricating steps of a method for forming a metal-insulating-metal capacitor and an interconnection, herein the method is in accordance with an embodiment of the invention.

One embodiment disclosed here is a method for forming a MIM capacitor and a copper interconnection. The present method is illustrated by FIG. 1A to FIG. 1D and comprises the following steps:

Referring to FIG. 1A, first a substrate 100 is provided. The substrate 100 comprises different devices therein and a plurality of copper blocks 142 under the surface of the substrate 100. Those copper blocks 142 are used for interconnections or the electrode of the MIM capacitor, and there is a first barrier layer 140 capping those copper blocks to prevent spiking between copper blocks 142 and substrate 100. Next, a first silicon nitride layer 132 and a second IMD layer 122 are sequentially formed on the first IMD layer 120. The first silicon nitride layer 130 and the second silicon nitride layer 132 are formed by plasma enhanced chemical vapor deposition. More silicon nitride layers and IMD layers may be permitted thereon depending on layout rule.

Figure 1B:
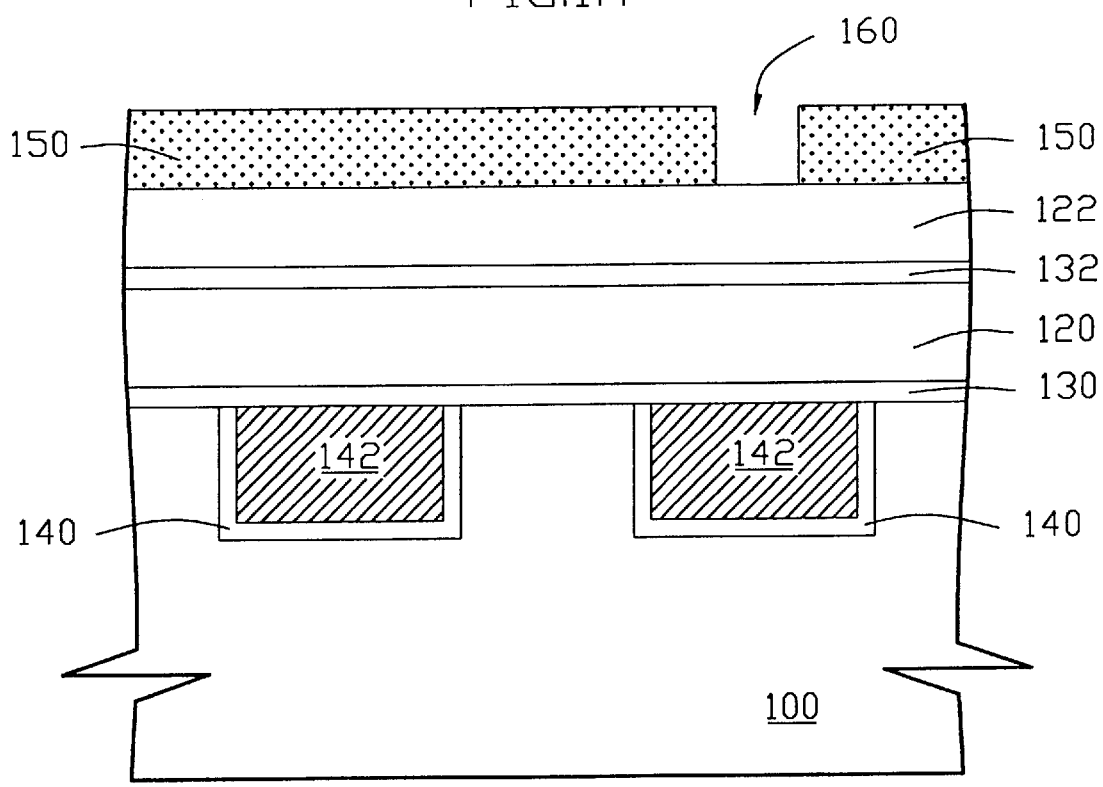

Referring to FIG. 1B, a first mask 150 is formed on the second IMD layer 122. The first mask 150 is made of photoresist and has a first opening 160 to expose the second IMD layer 122.

Figure 1C:
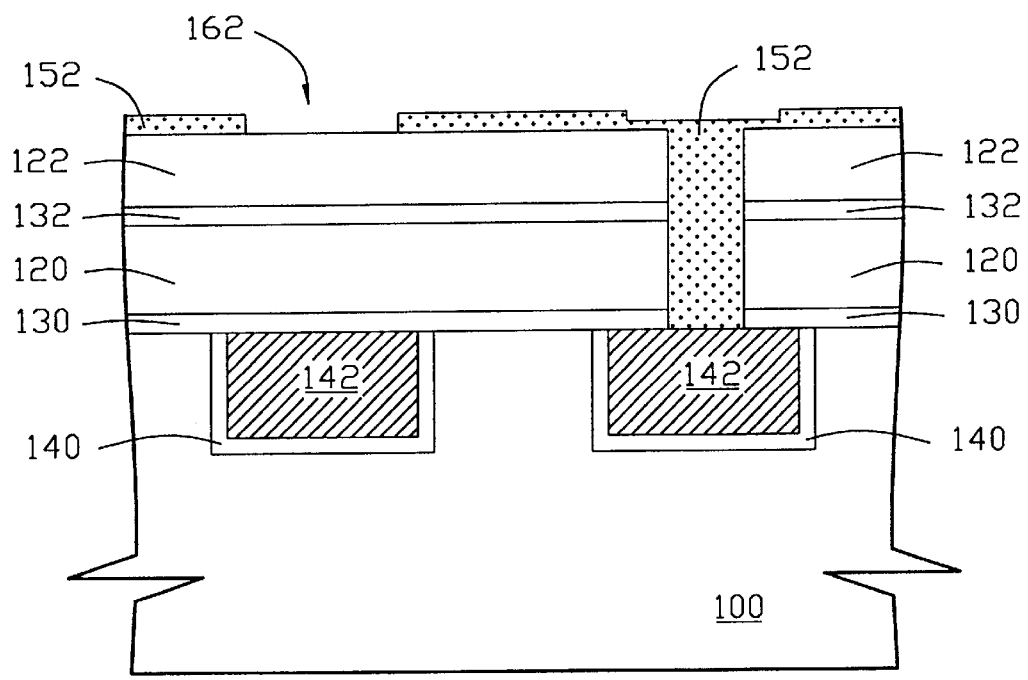

Referring to FIG. 1C, after a first etching process, a via through the second IMD layer 122, the second silicon nitride layer 132, the first IMD layer 120 and the first silicon nitride layer 130 is formed to expose one of copper blocks 142. Then, a second mask 152 is formed on the second IMD layer 122 and the via is filled by the second mask 152. The second mask 152 is made of photoresist and comprises a second opening 162 to expose the second IMD layer 122. Thereafter, a second etching process follows to form a hole through the second IMD layer 122, the second silicon nitride layer 132 and the first IMD layer 120 to expose the first silicon nitride layer 130. The hole is above one of copper blocks 142 and the space of the hole is used for the electrode of the MIM capacitor.

Figure 1D:
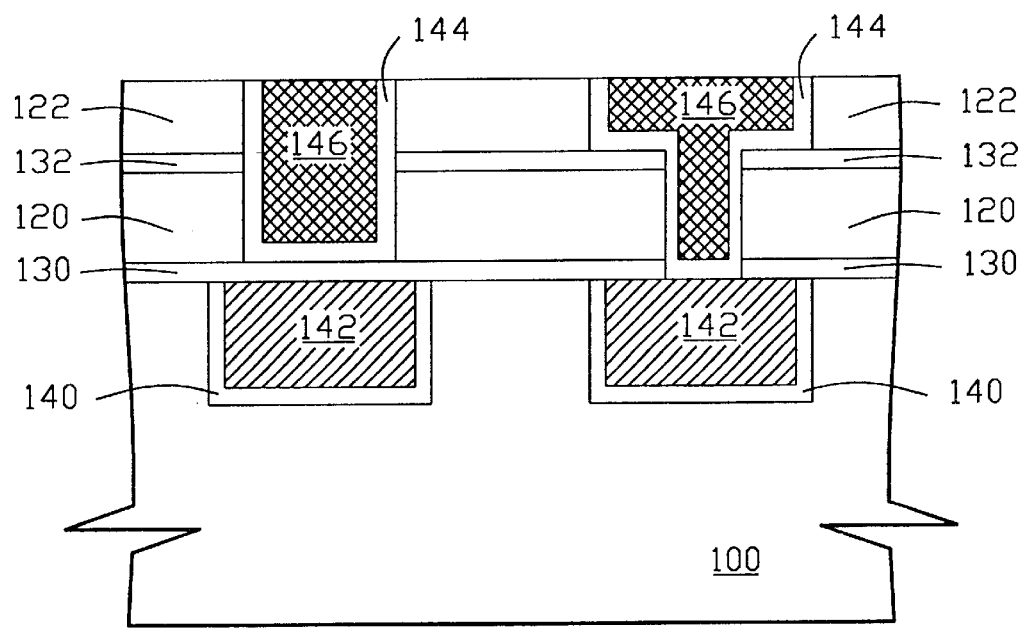

Referring to FIG. 1D, after stripping the second mask 152, a second barrier layer 144 is deposited on the via and the hole to prevent spiking. Then, a copper layer 146 is deposited to fill the via and the hole. The copper in the hole is used as a top electrode of the MIM capacitor and the copper in the via is used as an interconnection. Thereafter, a planarizing process is proceeded to remove excess copper layer 146 and second barrier layer 144 on the second IMD layer 122.

Figure 2A:
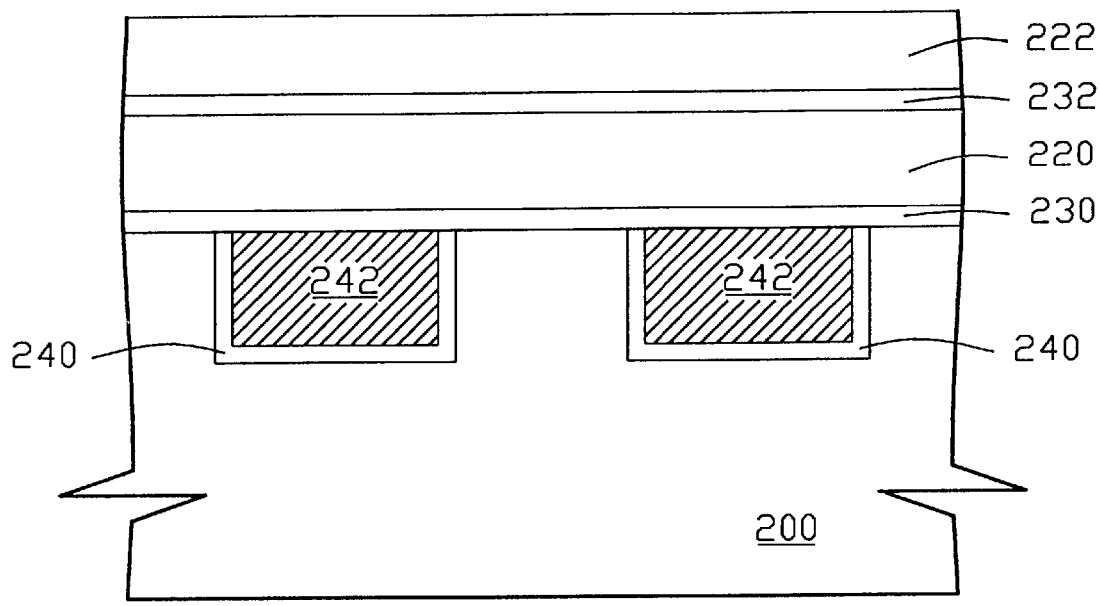
FIG. 2A to FIG. 2D are four brief cross-section illustrations showing the fabricating steps of a method for forming a metal insulator-metal capacitor and an interconnection, herein the method is in accordance with another embodiment of the invention.

Another embodiment disclosed in here is a method for forming a MIM capacitor and a copper interconnection. The present method is illustrated by FIG. 2A to FIG. 2D and comprises the following steps:

Referring to FIG. 2A, first a substrate 200 is provided. The substrate 200 comprises different devices therein and a plurality of copper blocks 242 under the surface of the substrate 200. Copper blocks 242 are used for interconnections or the electrode of the MIM capacitor, and there are a first barrier layer 240 capping those copper blocks 242 to prevent spiking between copper blocks 242 and substrate 200. Next, a first silicon nitride layer 230 is deposited on the substrate 200 and then a first inter-metal-dielectric (IMD) layer 220 is formed on the first silicon nitride layer 230. Next, a second silicon nitride layer 232 and a second IMD layer 222 are sequentially formed on the first IMD layer 220. The first silicon nitride layer 230 and the second silicon nitride layer 232 are formed by plasma enhanced chemical vapor deposition. More silicon nitride layers and IMD layers may be permitted thereon depending on layout rule.

Figure 2B:
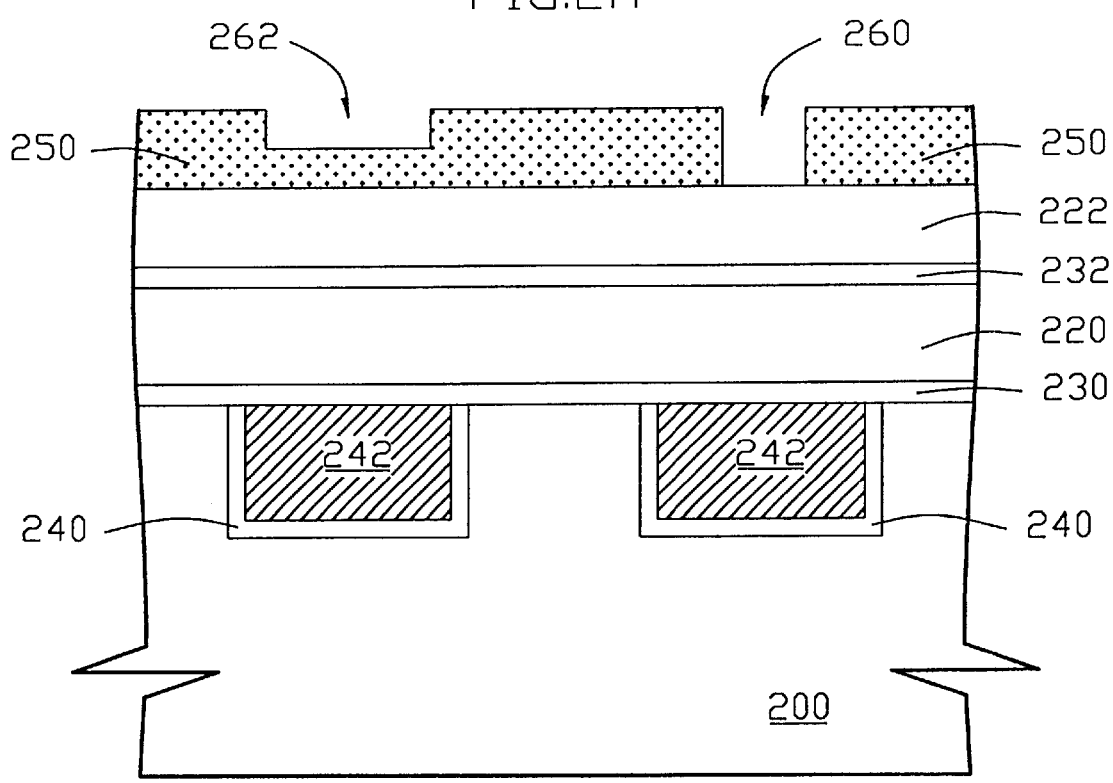

Referring to FIG. 2B, a first mask 250 is formed on the second IMD layer 222. The first mask 250 is made of photoresist and comprises a first opening 260 to expose the second IMD layer 222 and a second opening 262 which is shallow trench in the first mask.

Figure 2C:
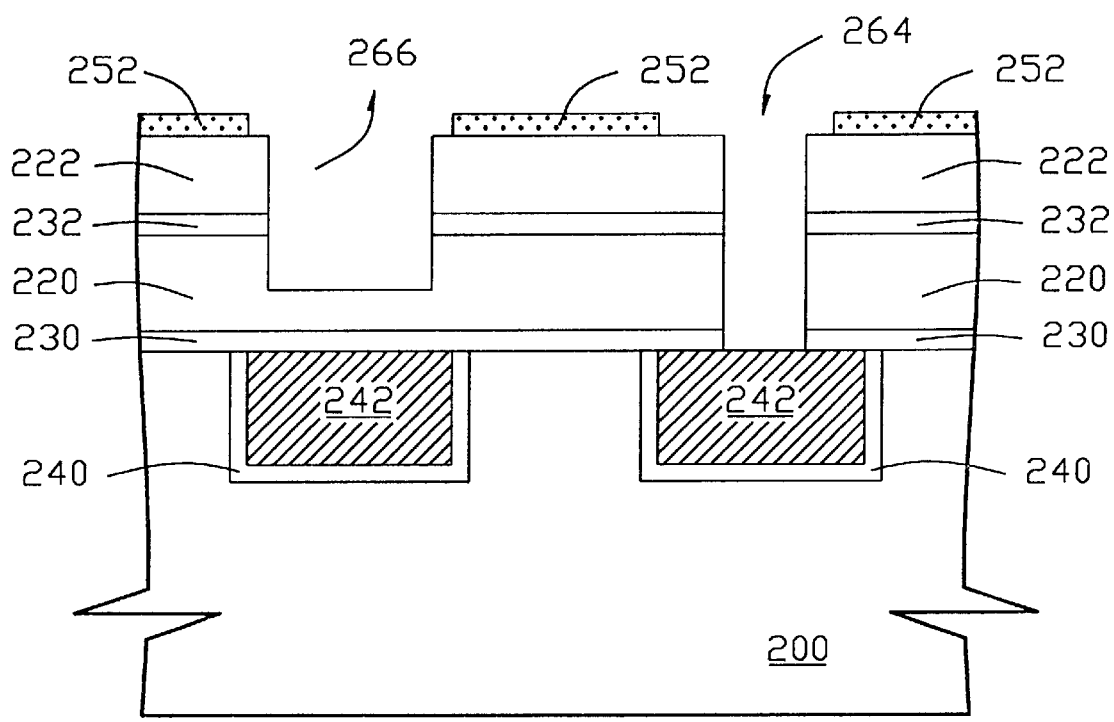

Referring to FIG. 2C, after a first etching process, a via 264 through the second IMD layer 222, the second silicon nitride layer 232, the first IMD layer 220 and the first silicon nitride layer 230 is formed to expose one of copper blocks 242. At the same time, a pre-hole 266 is formed to expose the first IMD layer 220. Then, a second mask 252 is formed on the second IMD layer 222 to expose the via 264 and the pre-hole 266. The second mask 252 is made of photoresist. Following, a second etching process follows to form a hole 268 in the pre-hole region through the first IMD layer 220 to expose the first silicon nitride layer 230. The hole 268 is above one of copper blocks 242 and the space of the hole 268 is used for the top electrode of the MIM capacitor.

Figure 2D:
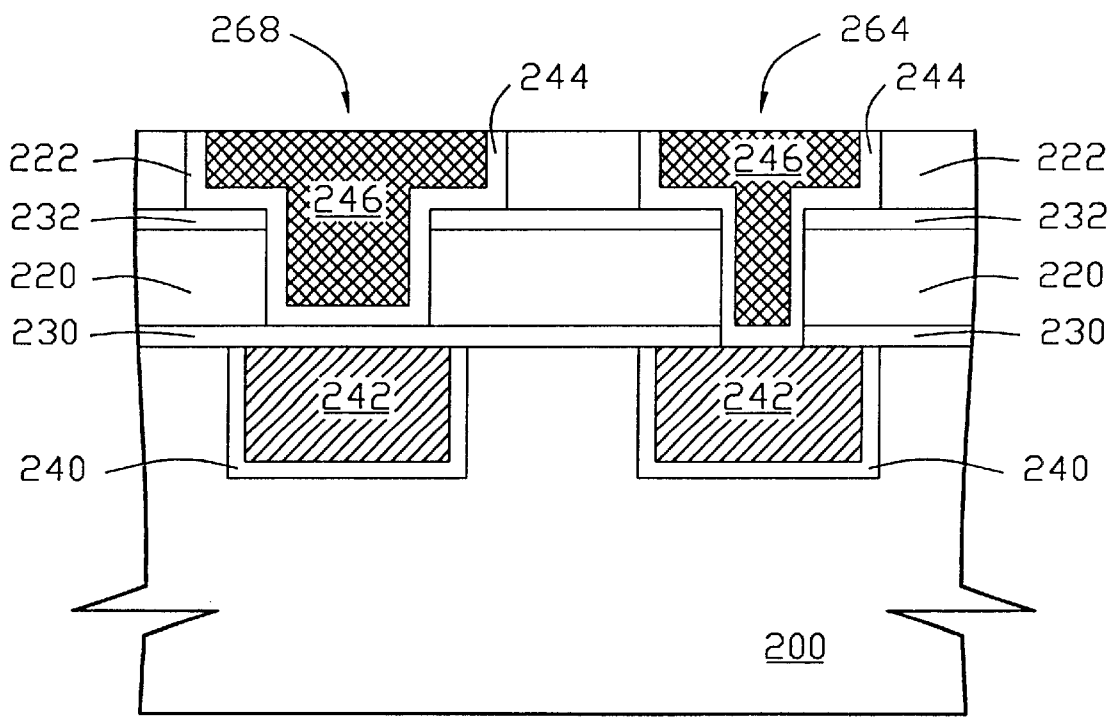

Referring to FIG. 2D, after stripping the second mask 252, a second barrier layer 244 is deposited on the via 264 and the hole 268 to prevent spiking. Then, a copper layer 246 is deposited to fill the via 264 and the hole 268. The copper in the hole 268 is deposited to fill the via 264 and the hole 268. The copper in the hole 268 is used as a top electrode of the MIM capacitor and the copper in the via 264 is used as an interconnection. Thereafter, a planarizing process is proceeded to remove excess copper layer 246 and second barrier layer 244 on the second IMD layer 222.

To sum up the foregoing, the method for forming a MIM capacitor and a copper interconnection is provided in the present invention. As copper interconnect processes become more and more commonly used, copper used as the top and the bottom electrodes of the MIM capacitor can effectively eliminate one level of metallization. The present method can be easily achieved by using visible processes.

Of course, it is to be understood that the invention need not be limited to these disclosed embodiments. Various modification and similar changes are still possible within the spirit of this invention. In this way, the scope of this invention should be defined by the appended claims.

What is claimed is:

1. A method for forming a metal-insulator-metal (MIM) capacitor and an interconnect in integrated circuits, said method comprising:

providing a substrate with a plurality of conductive blocks under a surface of said substrate;

depositing a first nitride layer on said substrate;

forming a first inter-metal-dielectric (IMD) layer on said first nitride layer;

depositing a second nitride layer on said first IMD layer;

forming a second IMD layer on said second nitride layer;

forming a first mask on said second IMD layer with a first opening to expose said second IMD layer;

using a first etching process to form a via through said second IMD layer, said second nitride layer, said first IMD layer and said first nitride layer in said first opening to expose one of said conductive blocks;

using a second etching process to form a hole to expose said first nitride layer, wherein said hole above one of said conductive blocks; and filling a conductive material into said via and said hole to respectively form said interconnect and said MIM capacitor.

2. The method according to claim 1, wherein said second etching process comprises following steps:

providing a second mask on said second IMD layer with a second opening to expose said second IMD layer, wherein said via be filled by said second mask;

etching said second IMD layer, said second nitride layer and said first IMD layer in said second opening to form said hole; and stripping said second mask.

3. The method according to claim 1, wherein said first mask further comprises a third opening above one of said conductive blocks.

4. The method according to claim 3, wherein said first etching process further forms a pre-hole in said third opening to expose said first IMD layer.

5. The method according to claim 4, wherein said second etching process comprises following steps:

providing a second mask on said second IMD layer with a second opening to expose said pre-hole and said via;

etching said first IMD layer in said second opening to form said hole to expose said first nitride layer, wherein said conductive block in said via be used as a hark mask; and stripping said second mask.

6. The method according to claim 1, wherein said conductive blocks and said conductive material are made of copper.

7. The method according to claim 1, wherein said conductive blocks further comprise a barrier metal layer capping said conductive blocks.

8. The method according to claim 1, further comprising a step of depositing a barrier metal layer before filling said conductive material into said via and said hole.

9. The method according to claim 1, further comprising a planarizing step after filling said conductive material in said via and said hole.

10. The method according to claim 1, wherein said first nitride layer and said second nitride layer are made of silicon nitride.

11. The method according to claim 1, wherein said first nitride layer and said second nitride layer are formed by plasma enhanced chemical vapor deposition.

12. A method for forming a metal-insulator-metal (MIM) capacitor and a copper interconnect in a mixed mode signal process, said method comprising:

providing a substrate with a plurality of copper blocks under a surface of said substrate;

depositing a first silicon nitride layer on said substrate;

forming a first inter-metal-dielectric (IMD) layer on said first silicon nitride layer;

depositing a second silicon nitride layer on said first IMD layer;

forming a second IMD layer on said second silicon nitride layer;

forming a first mask on said second IMD layer with a first opening exposing said second IMD layer;

using a first etching process to form a via through said second IMD layer, said second silicon nitride layer, said first IMD layer and said first silicon nitride layer in said first opening to expose one of said copper blocks;

providing a second mask on said second IMD layer with a second opening to expose said second IMD layer, wherein said via be filled by said second mask;

etching said second IMD layer, said second silicon nitride layer and said first IMD layer in said second opening to form a hole to expose said first silicon nitride layer, wherein said hole above one of said copper blocks; and forming a copper layer to fill said via and said hole to respectively form said copper interconnect and said MIM capacitor.

13. The method according to claim 12, wherein said copper blocks further comprise a barrier metal layer capping said copper blocks.

14. The method according to claim 12, further comprising a step of depositing a barrier metal layer before forming said copper layer to fill said via and said hole.

15. The method according to claim 12, further comprising a planarizing step after forming said copper layer to fill said via and said hole.

16. The method according to claim 12, wherein said first silicon nitride layer and said second silicon nitride layer are formed by plasma enhanced chemical vapor deposition.

17. A method for forming a metal-insulator-metal (MIM) capacitor and a copper interconnect in a mixed mode signal process, said method comprising:

providing a substrate with a plurality of copper blocks under a surface of said substrate;

depositing a first silicon nitride layer on said substrate;

forming a first inter-metal-dielectric (IMD) layer on said first silicon nitride layer;

depositing a second silicon nitride layer on said first IMD layer;

forming a second IMD layer on said second silicon nitride layer;

forming a first mask on said second IMD layer with a first opening above one of said copper blocks to expose said second IMD layer and a second opening above one of said copper blocks, wherein said second opening having a thinner thickness of said first mask;

using a first etching process to form a via through said second IMD layer, said second silicon nitride layer, said first IMD layer and said first silicon nitride layer in said first opening to expose one of said copper blocks and a pre-hole through said second IMD layer, said second silicon nitride layer and said first IMD layer in said second opening to expose said first IMD layer;

forming a second mask on second IMD layer to expose said pre-hole and said via;

sing a second etching process to form said hole to expose said first silicon nitride layer, wherein said copper block in said via be used as a hard mask in said second etching process; and forming a copper layer to fill said via and said hole to respectively form said copper interconnect and said MIM capacitor.

18. The method according to claim 17, wherein said copper blocks further comprise a barrier metal layer capping said copper blocks.

19. The method according to claim 17, further comprising a step of depositing a barrier metal layer before forming said copper layer to fill said via and said hole.

20. The method according to claim 17, further comprising a planarizing step after forming said copper layer to fill said via and said hole.

21. The method according to claim 17, wherein said first silicon nitride layer and said second silicon nitride layer are formed by plasma enhanced chemical vapor deposition.

* * * * *